(12) United States Patent
Redaelli

(10) Patent No.: US 10,418,119 B2
(45) Date of Patent: Sep. 17, 2019

(54) APPARATUSES AND/OR METHODS FOR OPERATING A MEMORY CELL AS AN ANTI-FUSE

(71) Applicant: Micron Technology, Inc., Boise, ID (US)

(72) Inventor: Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 15/691,465

(22) Filed: Aug. 30, 2017

(65) Prior Publication Data

US 2017/0365353 A1    Dec. 21, 2017

Related U.S. Application Data

(60) Continuation of application No. 15/251,993, filed on Aug. 30, 2016, now Pat. No. 9,805,817, which is a division of application No. 14/986,329, filed on Dec. 31, 2015, now Pat. No. 9,455,033, which is a division of application No. 13/543,469, filed on Jul. 6, 2012, now Pat. No. 9,257,197.

(51) Int. Cl.

| | |
|---|---|
| *G11C 17/18* | (2006.01) |
| *G11C 13/00* | (2006.01) |
| *G11C 17/16* | (2006.01) |
| *G11C 17/14* | (2006.01) |
| *G11C 14/00* | (2006.01) |

(52) U.S. Cl.
CPC .......... *G11C 17/18* (2013.01); *G11C 13/0004* (2013.01); *G11C 13/0069* (2013.01); *G11C 17/14* (2013.01); *G11C 17/16* (2013.01); *G11C 17/165* (2013.01); *G11C 14/009* (2013.01); *G11C 2213/52* (2013.01); *G11C 2213/72* (2013.01)

(58) Field of Classification Search
CPC .......... G11C 17/08; G11C 17/14; G11C 17/16
USPC .................................................. 365/163, 148
See application file for complete search history.

(56) References Cited

U.S. PATENT DOCUMENTS

| | | |
|---|---|---|
| 5,250,459 A | 10/1993 | Lee |
| 5,485,032 A | 1/1996 | Schepis et al. |
| 6,891,747 B2 | 5/2005 | Bez et al. |
| 7,304,888 B2 | 12/2007 | Knall |
| 7,422,926 B2 | 9/2008 | Pellizzer et al. |
| 7,660,180 B2 | 2/2010 | Boeve et al. |
| 7,674,691 B2 | 3/2010 | Cestero et al. |
| 7,675,766 B2 | 3/2010 | Kozicki |
| 7,782,650 B2 | 8/2010 | Bertin et al. |
| 7,924,608 B2 | 4/2011 | Campbell |
| 7,960,808 B2 | 6/2011 | Burr et al. |
| 7,961,507 B2 | 6/2011 | Liu et al. |
| 8,250,293 B2 | 8/2012 | Happ et al. |
| 8,363,450 B2 | 1/2013 | Kim et al. |
| 8,848,423 B2 | 9/2014 | Chung |

(Continued)

OTHER PUBLICATIONS

Pirovano, et al., "Self-aligned μTrench phase-change memory cell architecture for 90nm technology and beyond", Solid State Device Research Conference, Sep. 11-13, 2007, ESSDERC 2007, 37th European, pp. 222-225, IEEE.

*Primary Examiner* — Han Yang
(74) *Attorney, Agent, or Firm* — Holland & Hart LLP (57) ABSTRACT

Embodiments disclosed herein relate to operating a memory cell as an anti-fuse, such as for use in phase change memory, for example.

21 Claims, 5 Drawing Sheets

(56) References Cited

U.S. PATENT DOCUMENTS

| | | |
|---|---|---|
| 8,994,489 B2 | 3/2015 | Servalli et al. |
| 9,012,307 B2 | 4/2015 | Jo et al. |
| 2006/0113520 A1* | 6/2006 | Yamamoto .............. H01L 45/06 257/3 |
| 2007/0278529 A1* | 12/2007 | Lai ...................... H01L 27/2436 257/209 |
| 2008/0094871 A1* | 4/2008 | Parkinson ............ G11C 7/1006 365/100 |
| 2009/0180313 A1 | 7/2009 | Deweerd et al. |
| 2010/0096610 A1 | 4/2010 | Wang et al. |
| 2010/0163833 A1 | 7/2010 | Borghi et al. |
| 2012/0205608 A1* | 8/2012 | Yamauchi ............. H01L 45/085 257/4 |

* cited by examiner

APPARATUSES AND/OR METHODS FOR OPERATING A MEMORY CELL AS AN ANTI-FUSE

CROSS REFERENCE

The present Application for Patent is a continuation of U.S. patent application Ser. No. 15/251,993 by Redaelli, entitled "Apparatuses and/or Methods for Operating a Memory Cell as an Anti-Fuse," filed Aug. 30, 2016, which is a divisional of U.S. patent application Ser. No. 14/986,329 by Redaelli, entitled "Apparatuses and/or Methods for Operating a Memory Cell as an Anti-Fuse," filed Dec. 31, 2015, which is a divisional of U.S. patent application Ser. No. 13/543,469 by Redaelli, entitled "Apparatuses and/or Methods for Operating a Memory Cell as an Anti-Fuse," filed Jul. 6, 2012, assigned to the assignee hereof, and each of which is expressly incorporated by reference in its entirety herein.

FIELD

Subject matter disclosed herein may relate to apparatuses, such as computing platforms and integrated circuit devices that include memory cells, and may relate, more particularly, to memory cells and their operation.

BACKGROUND

Integrated circuit devices, such as memory devices, for example, may be found in a wide range of electronic devices. For example, memory devices may be used in any of a number of apparatuses, such as computers, digital cameras, cellular telephones, personal digital assistants, etc. One example of a memory comprises read-only memory (ROM). A benefit of read-only memory includes the ability to retain a programmed state on a long-term basis. One approach to program read-only memory cells is to form open or closed connections (e.g., electrical paths that are of a relatively low or relative high resistance) in particular memory cells of a memory array. Therefore, an open or closed connection may be employed to represent a binary zero or a binary one, for example, and may retain a programmed state for a relatively long-term basis. For example, a fuse that has a normally closed connection may be programmed (e.g., blown) to have an open connection. Similarly, an anti-fuse that has a normally open connection may be programmed to have a closed connection. Since the fuses or anti-fuses are permanently programmed, the memory may be considered one-time programmable ROM.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit claimed subject matter in scope and/or in equivalents.

DETAILED DESCRIPTION

In the following, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Reference throughout this specification to "one embodiment," "an embodiment," or similar expressions mean that a particular feature, structure, and/or characteristic described may be included in one or more embodiments of claimed subject matter. Thus, appearances of phrases such as "in one embodiment," "an embodiment," or similar expressions in various places throughout this specification are not necessarily all referring to the same embodiment. For example, particular features, structures, and/or characteristics may be combined in one or more embodiments.

Embodiments of claimed subject matter may include methods and/or apparatuses (e.g., an individual apparatus or a combination of apparatuses or components thereof) for performing operations. An apparatus may be specially constructed for desired purposes and/or an apparatus may comprise a general-purpose computing device capable of operating in accordance with a computer program stored in memory, for example. A program may be stored in memory, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs) and/or FLASH memories, phase change memories (PCM) and/or any other type of media, such as a computer readable medium, suitable for storing instructions, such as software instructions, for example.

A memory typically may comprise a non-transitory component. In this context, a non-transitory memory may include a component that is tangible, meaning that the component has a concrete physical form, although the component may change its physical state. Thus, for example, non-transitory refers to a component capable of remaining tangible despite a change in physical state.

In describing embodiments of claimed subject matter, the term "bit" corresponds to a binary digit of data, such as represented by a state of a binary digital signal, which is sometimes also referred to as a logic signal, a binary signal, a logic state, or a binary state. The value of a bit, a fraction of a bit, or multiple bits may be stored by programming (e.g., writing to) a memory cell, such as a single transistor, for example, to one of a plurality of physical states, referred to here as a data state for convenience. For example, in a single level memory cell, the cell might be programmed to a first (e.g., logic 1) data state or a second (e.g., logic 0) data state. Additionally, multiple binary digital signals and/or multiple data states comprising individual binary digital signals and/or data states may be organized and/or aggregated to construct (e.g., assemble) a "symbol," which may collectively represent, for example, two bits, four bits, eight bits, 10 bits, and so forth. In one example, a 2-bit symbol may comprise a binary value of 00, 01, 10, or 11. In some cases, a single memory cell may be selectively programmed to a respective data state representing any one of those values. For example, a binary 00 value for a 2-bit symbol may be stored by programming a memory cell to a respective one of four possible data states (e.g., corresponding to a respective range of threshold voltage levels in an embodiment). In a similar manner, a particular value of a 4-bit symbol (e.g., 0101) may be stored by programming one or more memory cells to a respective one of 16 possible data states, and a particular value of an 8-bit symbol (e.g., 0000 0110) may be stored by programming one or more memory cells to a respective one of 256 different data states, and so forth. Any of the foregoing symbols may be communicated as representing one or more measurable physical properties (e.g., an acoustic, current, radiation, and/or voltage level) of, for example, one or more signals or states, for example.

Memory may be employed in a variety of contexts. As an example, memory may be included in a computing system. In this context, the term computing system refers to at least a processor and memory coupled by a bus. Likewise, in this application, the terms memory, memory system, memory module, memory device and/or memory apparatus are used interchangeably unless the context of usage indicates otherwise. A memory cell, however, refers to a unit of storage within a memory and a memory array refers to an array of memory cells. It is understood, however, that a memory, memory system, memory module, memory device and/or memory apparatus may also include other circuitry or components to enable use of the memory cells, for example. Likewise, a memory subsystem refers to a subportion of a memory system.

In an example implementation, an apparatus in the form of a nonvolatile memory device may communicate with one or more processors or other memory access devices via (e.g., through) a plurality of associated physical interfaces. A nonvolatile memory device may, for example, comprise a phase change memory (PCM), charge storage memory (such as that commonly referred to as flash memory), or the like or any combination thereof, though claimed subject matter is not limited to such examples. A nonvolatile memory device may, for example, comprise a single channel memory device or a multichannel memory device. In a multi-channel device, for example, two or more of a plurality of physical interfaces may comprise a substantially similar type or differing types. By way of non-limiting example, in certain implementations, one interface may comprise a parallel interface while another interface may comprise a serial interface.

It is, of course, understood that claimed subject matter is not limited in scope to a particular embodiment, implementation, or example which may be provided primarily for purposes of illustration. Rather, a variety of hardware, firmware, or software embodiments, or combinations thereof, is possible (other than software per se) and is intended to be included within claimed subject matter. Therefore, although aspects of claimed subject matter may be described below with reference to one or more examples or illustrations, it is to be understood that any examples or illustrations so described are intended to be non-limiting.

Figure 1:
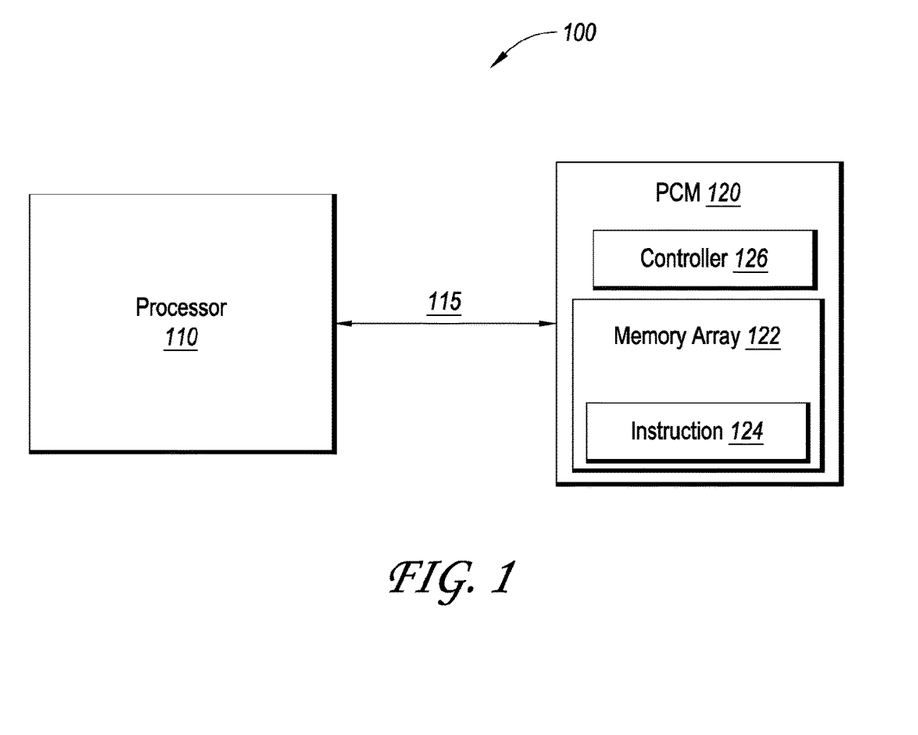
FIG. 1 is a schematic diagram depicting an example computing platform including a phase change memory device, according to an embodiment.

The term computing platform as used herein refers to a system (e.g., a computing system) and/or a device that includes the ability to process and/or store data in the form of signals and/or states. Thus, a computing platform, in this context, may comprise hardware, software, firmware or any combination thereof (other than software per se). Computing platform 100, as depicted in FIG. 1, is merely one such example, and claimed subject matter is not limited to this particular example. For one or more embodiments, a computing platform may comprise any of a wide range of electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein may also be executed and/or controlled, in whole or in part, by a computing platform.

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part affect some suitability factors, such as those mentioned above, including storage density, physical size, cost/ease of manufacture, and/or reliability, for example. In an embodiment, multi-level programming (MLP) capabilities for one or more memory cells in a memory device may be utilized to increase storage density, for example. As used herein, "multi-level programming" may refer to one or more memory cells of a memory device, such as a PCM device, as an example, capable of being programmed to any of more than two states. Such a memory cell may be referred to as a multi-level cell (MLC). Likewise, a conventional single-level phase change memory (PCM) memory cell may be programmed to a "set" state or a "reset" state. Such a memory cell may be referred to as a single-level cell (SLC), also mentioned previously. A multi-level PCM cell may be programmed, in addition to set or reset states, to one or more intermediate states between a set state and a reset state, in an embodiment, for example.

FIG. 1 is a schematic diagram depicting an example computing platform 100 including an example phase change memory (PCM) device 120. In an embodiment, PCM device 120 may comprise a storage area, including memory array 122 of PCM cells. PCM device 120 may, in an example embodiment, be coupled to a processor 110 by way of an interconnect 115. As will be understood from the description of FIGS. 3A-3C below, the memory array 122 of PCM cells can include anti-fuse cells either in a dedicated array or as a portion of a larger PCM array.

PCM device 120 in an embodiment may comprise a controller 126. Additionally, memory array 122 may store instructions 124 that may include one or more applications that may be executed by a processor, such as 110, in accordance with an embodiment. Processor 110 may transmit a memory access command to PCM device 120, for example. Controller 126 may access one or more memory cells of memory array 122 at least in part in response to receiving a memory access command from processor 110, according to an embodiment. Of course, computing platform 100 is merely one example of a system (e.g., a computing system) implemented in accordance with claimed subject matter, and claimed subject matter is not limited in scope in these respects.

In an embodiment, one or more PCM cells of memory array 122 may comprise a phase change material, e.g., a chalcogenide material, such as one including germanium, antimony and tellurium (GST, e.g., Ge2Sb2 Te5). In an embodiment, the chalcogenide material can be provided without metal doping. In another embodiment, the chalcogenide material can be provided with metal doping. A memory device, such as PCM device 120, may program the phase change material, and thus the cell, to one of at least two different states. For example, in a binary system, such states may represent either a binary "0" or a binary "1." In an embodiment, a "set" state, representing a binary value of '1,' for example, may correspond to a crystalline, more conductive state for the phase change material of a cell, such as one or more cells of memory array 122. Also, in an embodiment, a "reset" state, representing a binary value of "0," for example, may correspond to an amorphous, more resistive state of a phase change material for a cell, such as one or more cells of memory array 122. In another embodiment, at least some individual cells may be programmed to any of two or more states, as represented by levels of resistance in an individual storage cell. In a PCM device, heat sufficient to change a phase of an individual cell, such as an individual cell of memory array 122, may be achieved by a current and/or voltage pulse employed with respect to a cell, such as one or more cells of memory array 122, in an embodiment. For example, a voltage may be provided (e.g., adjusted, applied, employed, generated, produced, etc.), such as across a cell, and/or a current may flow, such as through a cell, and, therefore, produce heat sufficient to effect a change in phase of the phase change material of a memory cell, thereby also changing its physical state. In some embodiments, rather than employing self-heating, a separate heater, utilizing current or voltage to generate heat, may be employed. In one or more example embodiments, memory arrays may comprise one or more technologies other than PCM, such as other resistive memory technologies and/or other types of memory, and claimed subject matter is, therefore, not limited in scope in this respect.

In an example embodiment, as mentioned, heat sufficient to change a phase of a cell, such as one or more PCM cells of memory array 122, may be provided, at least in part, by a current flowing through a cell. In an embodiment, a current may flow through a PCM cell, such as one or more cells of memory array 122, at least in part as a result of a voltage provided (e.g., applied) across electrically conductive electrodes in electrical contact with one or more memory cells, for example. In an embodiment, an amount of current to flow through a PCM cell, such as one or more cells of memory array 122, may depend at least in part on a resistance of a PCM cell. In an embodiment, a PCM cell, such as one or more cells of memory array 122, for example, may have different resistance characteristics depending at least in part on whether a cell is programmed to a more conductive, set state or to a more resistive, reset state, or to one or more intermediate states between a set state and a reset state, although claimed subject matter is not limited in scope in this respect. In an embodiment, a PCM device, such as PCM device 120, may detect a state of a particular cell based at least in part on a resistance of a particular cell in a programmed state, such as a set, reset, or intermediate state, for example. Also, in an embodiment, one or more current and/or voltage programming pulses may be provided (e.g., employed and/or adjusted) to program (e.g., write to) a cell, such as by affecting a phase change to achieve an appropriate resistance level for a target data state, for example.

As mentioned previously, one example of memory cells comprises onetime programmable read only memory (ROM) cells. A benefit of a ROM cell includes the ability to retain a state for a relatively long-term basis and/or under high thermal treatments. One approach to program ROM cells is to selectively form open or closed connections (e.g., paths of relatively high or relatively low electrical resistance) in fuses or anti-fuses. Therefore, open or closed connections may be employed to represent a binary zero or binary one. In the context of PCM, selectively operating a PCM cell as a fuse and/or an anti-fuse comprises one possible approach to implement a read-only memory cell of a memory array, for example. Therefore, in one embodiment, a PCM cell may be selectively operated as an anti-fuse, such as by selectively forming a relatively low resistance path through a region of chalcogenide material within the PCM cell, such as a metallic path which may be more electrically conductive than the surrounding phase-change material of the PCM cell, for example.

Figure 2:
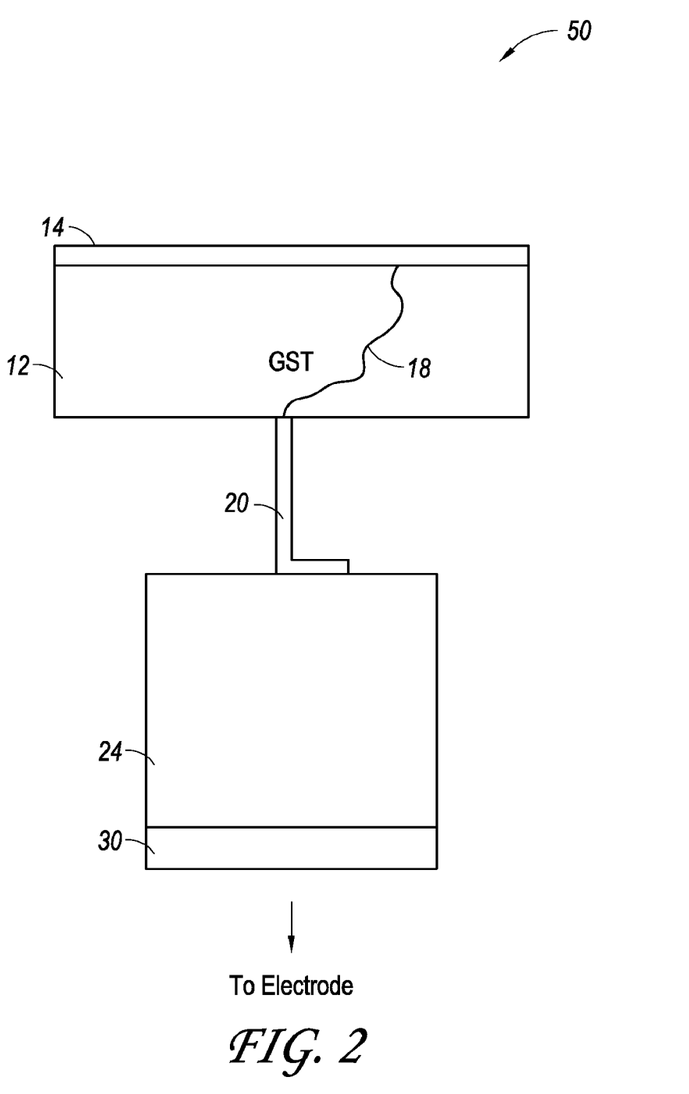
FIG. 2 is a schematic diagram depicting an example phase change memory cell, according to an embodiment.

FIG. 2 is a schematic diagram illustrating an embodiment of a memory cell 50 of a memory array in which a relatively low resistance metallic path 18 has been formed. Phase change material 12 of the memory cell is illustrated as comprising compound GST (e.g., Ge2Sb2Te5), in this example, and may include a capping material 14, which may operate as an electrode in this embodiment. The capping material 14 may comprise, for example, a layer of Ti, TiN, TiAlN, TaN, Ta, W, WN or a combination of those materials. A plug 24 comprising a metal prone to high temperature electromigration, such as tungsten, and a conductive heater 20 are illustrated. The heater 20, for example, may comprise a composite of Titanium, Tungsten, Silicon, and/or Nitrogen (e.g., TiSiN). A process for forming a PCM cell for a 90 nm (or smaller) semiconductor manufacturing process, including a conductive heater, for example, is described in A Pirovano et al., "Self-Align μ Trench Phase-Change Memory Cell Architecture for 90 nm Technology and Beyond," Solid State Device Research Conference, Sep.

11-13, 2007, ESSDERC 2007, although claimed subject matter is not limited in scope to employing the process or approach described. The plug 24 and the heater 20 may be formed from other materials with similar characteristics in other embodiments included within claimed subject matter.

As described previously, conventionally, the heater 20 may be employed to program (e.g., write to) the cell by effecting a change in physical state of the phase-change material of the memory cell. A change in physical state may be reflected in this example by a change in resistance accompanying the change in physical state. However, instead of and/or in addition to conventionally changing the state of the phase change material of the memory cell, for this particular embodiment, a relatively low resistance metallic path (e.g., comprising tungsten) can be formed through the phase change material of the memory cell, the path being complete or incomplete.

As illustrated in FIG. 2, an electrical path connects the phase change material 12 via the heater 20 to the tungsten plug 24. As further illustrated, a relatively low resistance metallic path, designated as 18 in the figure, was formed through the phase change material 12 to the capping material 14. To form the path 18, in operation, a voltage pulse may be provided across cell electrodes (not shown), referred to, for convenience, as top and bottom electrodes (without any loss of generality), so that current flows through the phase change material 12 via the tungsten plug 24 and the heater 20. It is worth nothing that the current/voltage pulse that creates the conductive path is significantly higher than currents/voltages employed for SET or RESET operations on similar phase change materials in a phase change memory cell.

As a result of current being provided, in this example, in the form of a forward biased current pulse, electro-migration of metallic ions, such as tungsten ions from the underlying plug, may occur. A shunt, therefore, may form within the phase change material. That is, a metallic path may be formed in the phase change material 12 having relatively lower resistance than that of the phase change material itself. Therefore, a relatively lower resistance path, in comparison with the phase change material, for example, between the electrodes, may ultimately be formed. Likewise, this path may comprise a sufficiently relatively low resistance to be considered a closed connection (e.g., highly conductive state) and, therefore, be employed to represent a binary one. The PCM cell has therefore, in effect, been programmed to represent a binary "1" state; however, this has been accomplished without and/or in addition to conventionally programming the PCM cell to a conventional set state.

Instead, with current flowing along the electrical path formed by the tungsten plug and the heater, electro-migration moves metallic ions, here, tungsten ions, from the plug 24 through the heater 20 (e.g., comprising TiSiN material) and the phase change material 12 (e.g., GST), forming the relatively lower resistance metallic path, here tungsten, through the phase change material 12. For example, a positive current or voltage bias may be provided via a top electrode or a negative current or voltage bias may be provided via a bottom electrode. In general, a voltage pulse provided across the electrodes may be employed to provide a corresponding forward biased current pulse.

For example, a forward biased current pulse may be provided for about one millisecond with a current density of about 500 Megaamps/cm2 (5×108 A/cm2). A duration range may be from about 1 microseconds to about 10 milliseconds, depending on the used current. A current may also be provided of about a few milliamps with a current density range of approximately from approximately 500 MA/cm2 to approximately 1000 MA/cm2. In particular, a current level may comprise a range of approximately from about 1 to about 5 milliamps. After formation of path 18, resistance along the path may be in a range of approximately a few kOhms (e.g., about 100 Ohm to about 5 kOhms).

Thus, an example implementation, as shown, comprises a PCM cell with a conductive heater and a tungsten plug, although, of course, claimed subject matter also includes other embodiments. A potential advantage to one or more embodiments is that the same cell may also be operated as a conventional PCM cell. The phase change material 12 and the plug 24 may also be implemented with different architectures (e.g., lance, pore, µtrench, wall, ring, etc.) or materials in other embodiments falling within claimed subject matter.

The typical resistance for a set state of a PCM cell formed using a 45 nm semiconductor manufacturing process may be approximately in the range of about 10-20 kOhm. However, after forming a metallic path 18, the PCM cell of the currently described embodiment may have a resistance approximately in a range from approximately 100 Ohm to approximately 5 kOhms. Thus, for an embodiment, a ROM memory may be realized by exploiting a lower resistance resulting from selectively forming a metallic path 18 in a PCM cell to realize a closed connection and a PCM set state for a relative higher resistance connection, for example.

The same PCM cell, in one embodiment, may also be selectively operated as a fuse, such as by selectively forming a void in the PCM cell (e.g., in or adjacent to the phase change material 12). An example of operating a PCM cell as a fuse is described, for example, in US Patent Publication 20100163833, titled "Electrical Fuse Device Based on A Phase-Change Memory Element and Corresponding Programming Method," filed on Dec. 31, 2008, by Borghi et al., and U.S. patent application Ser. No. 13/276,523, titled "Fuses, and Methods of Forming and Using Fuses," filed on Oct. 19, 2011, by Redaelli et al.; although claimed subject matter is not limited to employing the described processes or approaches to operating a PCM cell as a fuse. Typical resistance of a PCM cell having a void is above about 1 MOhm. The ability to program the same type of cell to be either a fuse or an anti-fuse enhances the ability to define one-time programmable ROM.

In addition, to potentially increase the programming window available, a more stable resistance level may potentially result from selectively operating the PCM cell as an anti-fuse or a fuse in accordance with an embodiment.

Furthermore, it is known that the conventional set state of a PCM cell (used as "1" state in fuse standard working operation) obtained by a proper set electrical pulse can increase its resistance to the native value (higher that the set value), under a relatively high temperature bake, such as around 250° C., which may occur during chip assembly and mounting (particularly by soldering) on a device board, such as a motherboard. Such a change in set resistance may be undesirable for storing a set state in a ROM array. However, under similar baking conditions (e.g., around 250° C.), the resistance of a PCM cell programmed as an anti-fuse to have a metallic path 18 formed in its phase change material is stable and the device remains shorted to serve as an anti-fuse. This allows a more stable resistance level for the anti-fuse disclosed herein, compared to using only a PCM set state as a closed connection in a ROM array, for example.

FIG. 2 also depicts a selector 30, which may comprise a bipolar junction transistor (BJT) or a diode in one embodiment, or a field effect transistor (FET) in another embodiment. In operation, actuation of selector 30 may result in addressing the memory cell thereby providing a current flow which may be employed to program (e.g., write to) the PCM cell in a conventional PCM programming operation or which may alternately be employed to program the PCM cell as an anti-fuse, such as in the manner previously described.

Figure 3A:
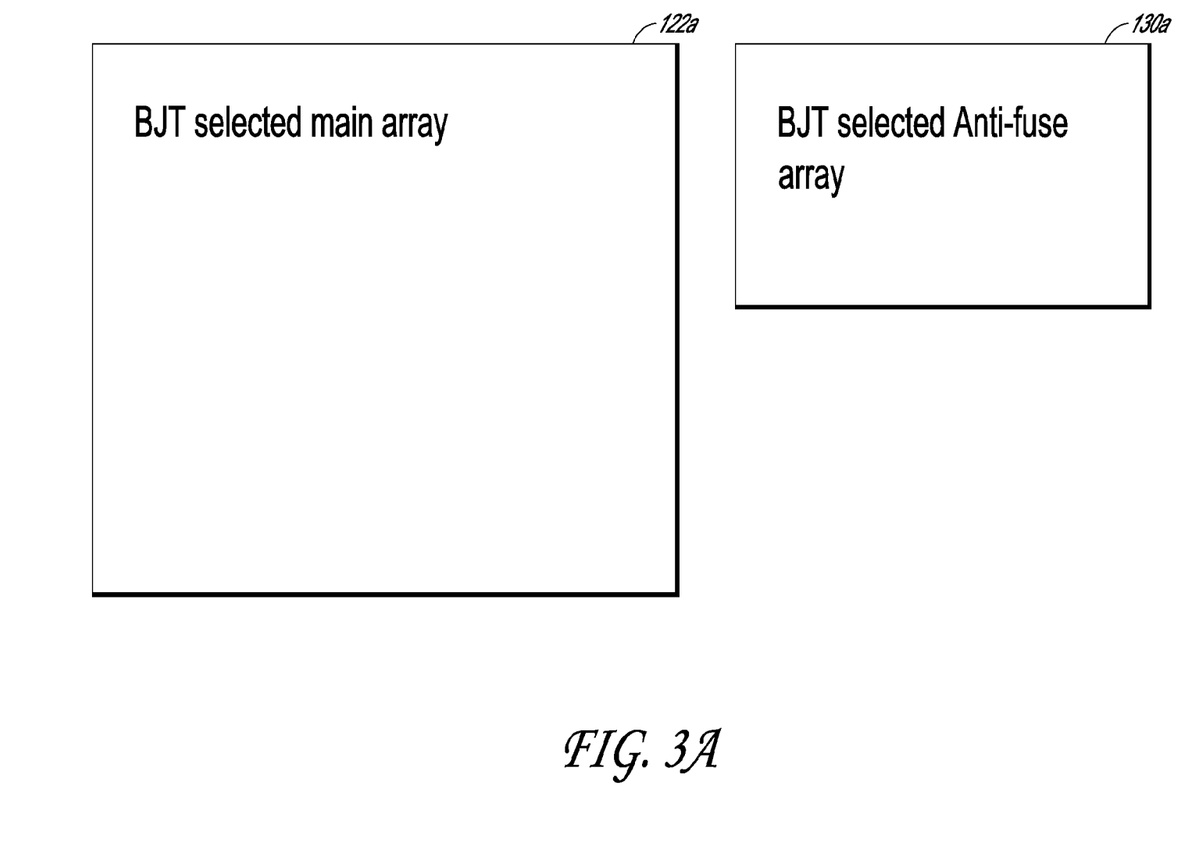
FIG. 3A is a schematic diagram depicting an example of one-time programmable read-only memory cells formed within a dedicated phase change memory array, wherein all cells can be selected by a bipolar junction transistor or a diode.

With reference to FIG. 3A, in one embodiment, a PCM cell to be employed as an anti-fuse, as described herein, can be realized in a dedicated ROM array 130a with similar features to the cells of a main phase change memory (PCM) array 122a. The arrangement of FIG. 3A may be suitable where both the anti-fuses, as described herein, and the reprogrammable PCM cells are employed with bipolar junction transistor (BJT). While FIG. 3A shows BJT selectors for both arrays, the skilled artisan will appreciate that the selectors for either or both arrays can be diode switches. The main PCM array 122a, which may be reprogrammable, can be manufactured using similar technology as the anti-fuse array 130a. For example, because both arrays 122a and 130a can employ BJT or diode switches, at least the selector transistors for both arrays, and possibly entire cells of both arrays, can be simultaneously manufactured in different real estate of a common integrated circuit.

Figure 3B:
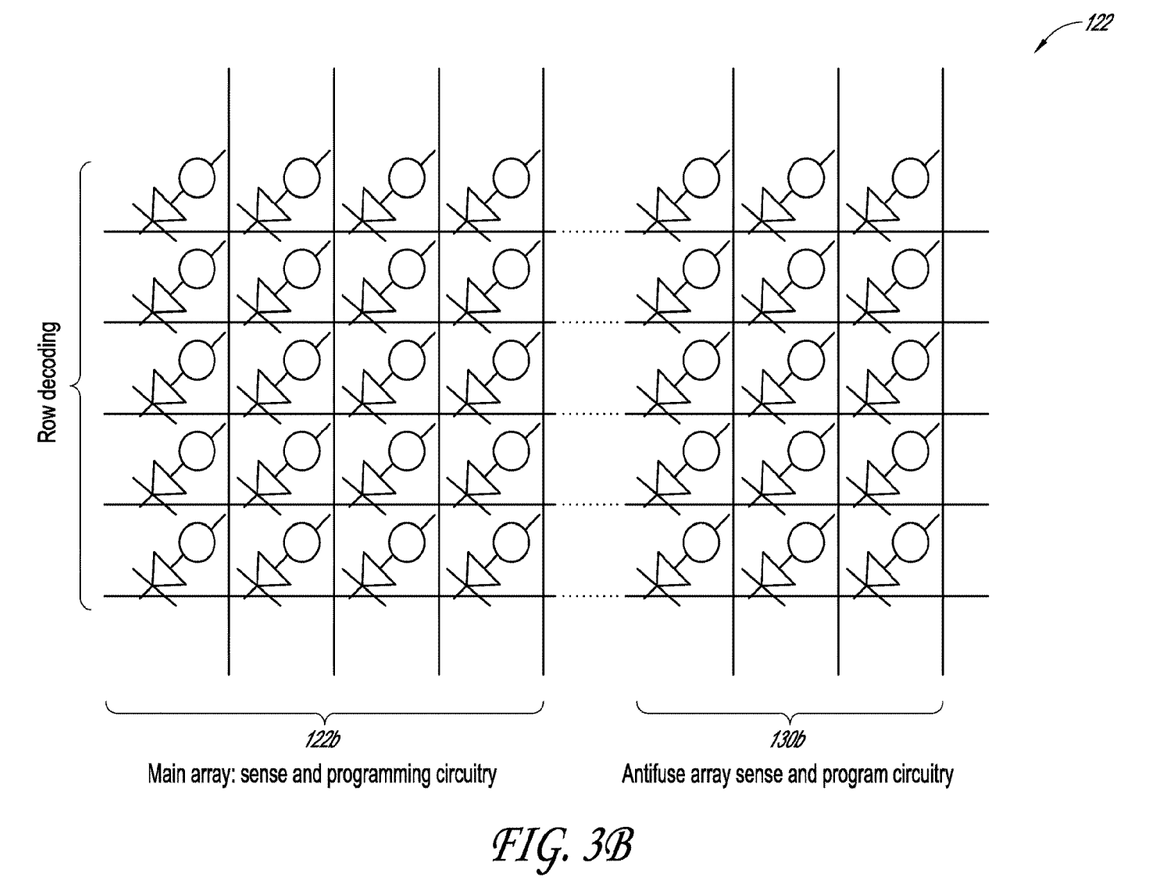
FIG. 3B is a schematic diagram depicting an example of one-time programmable read-only memory cells formed within the same main phase change memory array, wherein a part of the array is dedicated to one time programmable information storage.

FIG. 3B illustrates a phase change memory array 122 comprising a plurality of similarly constructed memory cells, each of which includes a phase change material coupled to a selector. The selector for each cell can be a BJT or a diode, which can be used to switch PCM cells between SET and RESET states, and optionally to intermediate resistive states, for normal PCM non-volatile, reprogrammable memory functions. Moreover, the BJT or diode is able to provide sufficient current to program a cell as an antifuse as described above, even with a reduced base-emitter junction area within the cell footprint of 4F2, where F is the minimum printable size by lithography. Therefore, multiple similar PCM cells can be provided in the PCM array 122, wherein a subset of those cells can be programmed to serve as one time programmable anti-fuses in a dedicated one time programmable read-only memory (ROM) portion 130b of the array 122, and another subset of the PCM array 122 can operate as reprogrammable PCM cells in the main array 122b. All cells within the PCM array 122, including the main array 122b and the ROM portion 130b, can have similar or even identical structures, but only those within the ROM portion 130b are programmed as anti-fuses, whereas the remainder of the cells of the main array 122b remain reprogrammable because voltages or currents insufficient to cause a short are employed for the programming. Furthermore, for a 45 nm semiconductor manufacturing process, either a BJT or a diode may be formed to be within the footprint constraints for the switch active area allotted within a 4F2 memory cell, and such a BJT or diode can both supply current for ordinary SET and RESET operations and supply current sufficient to create the metallic short 18 (FIG. 2). Thus, in effect, an anti-fuse is capable of being manufactured within this manufacturing process size limitation, and using common processing/structures as reprogrammable PCM cells. In one arrangement, the main array 122b and ROM portion 130b can share row decoders but have separate sense and programming circuitry.

Figure 3C:
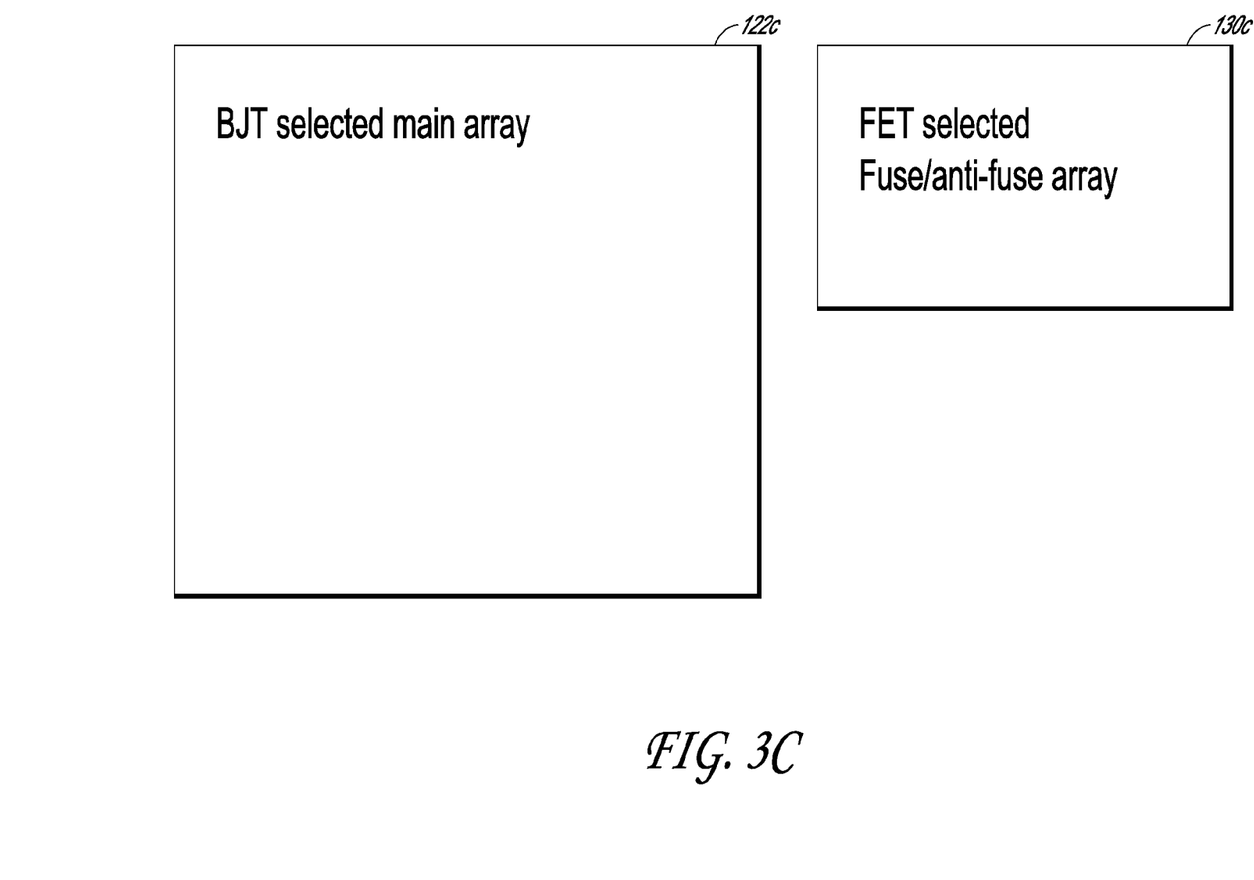
FIG. 3C an example of separated a one-time programmable read-only memory cells and reprogrammable phase change memory array, employing different switch technology from one another.

FIG. 3C shows another embodiment in which one time programmable ROM 130c, including antifuse structures, is formed separately from a reprogrammable main PCM array 122c. The arrangement of FIG. 3C may be suitable where the ROM 130c cells can be used as fuses and anti-fuses, such that different types of switches may be desirable for the main PCM array 122c and for the one time programmable ROM 130c. In contrast to the embodiments of FIGS. 3A and 3B, wherein the same type of switch can program a reprogrammable PCM cell or a one-time programmable anti-fuse, typically, to operate the PCM cell as a fuse, a reverse current is provided to the cell and a conventional pnp BJT selector is not suitable for this purpose. Therefore, in an embodiment where the PCM cell can be alternatively operated as a fuse or an antifuse, a field effect transistor (FET), such as a metal-oxide semiconductor field effect transistor (MOSFET), could be employed for the one time programmable ROM 130c. A FET formed by a 45 nm semiconductor manufacturing process may have a greater size than 4F2 (in the range of tens F2); accordingly, separately forming the ROM 130c from the main PCM array 122b allows the ROM 130c (including PCM fuses/antifuses) to employ a larger footprint for its FET switches, while the separate PCM array can employ smaller footprints for its BJT or diode switches and thus maximize density, lower power consumption, etc. The PCM cells of the ROM 130c can be one-time programmed as either fuses (by reverse current) or anti-fuses (applying strong forward or direct current).

It is also noted, however, that an implementation that includes a MOSFET selector may allow for the PCM cell to be selectively operated as a fuse or an anti-fuse in accordance with an embodiment. Likewise, in another implementation, in a memory device including a PCM array, for example, some PCM cells may have a BJT or diode selector and some may have a MOSFET selector. Therefore, a memory including such an implementation, for example, may also include a capability to operate as a fuse or an antifuse in accordance with an embodiment.

In an embodiment of a process of operating a PCM cell, such as illustrated FIG. 2, for example, the PCM cell may be selectively operated conventionally or as an antifuse (and/or as a fuse). Thus, for example, a relatively high density current forward biased pulse may be provided so that electro-migration of metallic ions, here tungsten ions, occurs through the phase change material to form a relatively low resistance metallic path in the phase change material of the cell. For example, for an embodiment, a forward biased current pulse may be provided (e.g., maintained) for a sufficient time and at a sufficient current level to form a metallic path in the phase change material of the cell that has a relatively lower resistance, in comparison, for example, with the resistance of the phase change material, such as in a set or reset state, so as to operate as a shunt through the phase change material.

For example, in an embodiment, the PCM material may be in electrical contact with a tungsten plug along an electrical path between two electrodes, such as described and illustrated previously. A voltage may be provided across the electrodes so as to provide a forward biased current pulse. In an embodiment, for example, actuating a bipolar transistor selector, a diode selector or a MOSFET selector for the PCM cell, for example, may result in providing the voltage across the electrodes. The forward biased current pulse may result in electro-migration so as to form a relatively low resistance tungsten path through the phase change material of the PCM cell. Likewise, an embodiment may also include selectively operating another PCM cell in the memory array as a fuse. For example, a void may be selectively formed in or adjacent to the phase change material of such a cell, such by actuating a MOSFET selector to provide sufficient current to form the void.

Another embodiment may comprise a storage medium having stored thereon instructions executable by a computing system to actuate a selector of a PCM cell, such as a BJT selector, a diode selector or a MOSFET selector, for example, to provide a forward biased current pulse. For example, in an embodiment, as a result execution of stored instructions, a relatively high current density forward biased current pulse may flow through phase change material of a PCM cell and a tungsten plug in electrical contact with the phase change material, resulting in electro-migration so as to form a relatively low resistance tungsten path through the phase change material of the PCM cell.

Accordingly, in one embodiment, an apparatus is provided. The apparatus includes a phase change memory (PCM) cell configured to be selectively operated as an antifuse. When operated as an anti-fuse and programmed, the PCM cell includes a metallic path formed in phase change material of the PCM cell.

The metallic path can include a tungsten path. The PCM cell can be part of a memory array of PCM cells. The memory array can include one or more other PCM cells configured to be selectively operated as anti-fuses. The memory array can includes one or more other PCM cells configured to be selectively operated as fuses. The metallic path can have a resistance below the resistance of the phase change material in a substantially crystalline state. The metallic path can have a resistance approximately in the range of from approximately 100 Ohms to approximately 5 kOhms. The apparatus can also include a bipolar junction transistor selector for the PCM cell. The apparatus can also include a diode selector for the PCM cell. The apparatus can also include a field effect transistor selector for the PCM cell.

In another embodiment, a method is provided for operating a phase change memory (PCM) cell as an anti-fuse. The cell includes phase change material in electrical contact with a metal plug along an electrical path between two electrodes. The method includes providing a voltage across the electrodes so as to provide a forward biased current pulse. The forward biased current pulse results in electro-migration from the metal plug so as to form a metallic path through the phase change material of the PCM cell.

The forward biased current pulse can have a duration approximately in the range of from approximately 1 microseconds to approximately 10 milliseconds. The forward biased current pulse can have a current level approximately in the range of from approximately 1 milliamp to approximately 5 milliamps. The forward biased current pulse can have a current density approximately in the range of from approximately 500 MegaAmps/cm2 to approximately 1000 MegaAmps/cm2. Actuating a bipolar transistor selector (BJT) can provide the forward bias current pulse. Actuating a diode selector can provide the forward bias current pulse. Actuating a field effect transistor selector can provide the forward bias current pulse. The PCM cell can be included in a memory array, and the method can include operating another PCM cell in the memory array as a fuse. Operating the other PCM cell in the memory array as a fuse can include forming a void in the other PCM cell. Forming the void in the other PCM cell can include actuating a field effect transistor selector for the other PCM cell to provide sufficient current to form the void.

In another embodiment, an apparatus includes a memory cell configured to be selectively programmed to one of at least a first state and a second state. The memory cell includes a phase change material, a plug comprising metal and a selector configured to selectively provide a forward bias to the phase change material through the plug. The forward bias is configured to cause metallic ions to be moved from the plug through the phase change material to form a metallic path through the phase change material. The wherein the resistance of the memory cell when programmed to the first state without the metallic path formed through the phase change material is less than the resistance of the memory cell when programmed to the second state without the metallic path formed through the phase change material. The resistance of the memory cell when the metallic path is formed through the phase change material is less than the resistance of the memory cell when programmed to the first state without the metallic path formed through the phase change material.

The memory cell can also include a conductive heater between the phase change material and the plug, and the forward bias can be configured to cause the metallic ions to be moved from the plug through the conductive heater and to the phase change material. A state of the phase change material when the memory cell is programmed to the first state can be more crystalline than when the memory cell is programmed to the second state. A state of the phase change material when the memory cell is programmed to the second state can be more amorphous than when the memory cell is programmed to the first state. The phase change material can include germanium, antimony and tellurium, and the metal can include tungsten. The selector can include a bipolar junction transistor. The memory cell can include a second selector configured to selectively provide a reverse bias to the phase change material. The reverse bias can form a void in the memory cell, where the resistance of the memory cell when the void is formed is more than the resistance of the memory cell when programmed to the second state without the void formed in the memory cell. The apparatus the second selector can include a field effect transistor (FET). The memory cell can additionally include capping material over the phase change material. The metallic path can be formed through the phase change material to the capping material, or the metallic path can be partially formed through the phase change material without reaching the capping material. The apparatus can include a selector configured to selectively provide a forward biased current pulse.

The terms, "and", "or", and "and/or" as used herein may include a variety of meanings that also are expected to depend at least in part upon usage context. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

In some circumstances, operation of a memory device, such as a change in state from a state representing a binary one to a state representing a binary zero or vice-versa, for example, may comprise a transformation, such as a physical transformation. With particular types of memory devices, such a physical transformation may comprise a physical transformation of an article to a different state. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as superposition, entanglement, and/or the like, which may involve quantum bits (qubits), for example. The foregoing is not intended to be an exhaustive list of all examples in which a change in state form a state representing a binary one to a state representing a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter. Therefore, it is intended that claimed subject matter not be limited to the particular examples disclosed, but that claimed subject matter may also include all aspects falling within the scope of appended claims and/or equivalents thereof.

What is claimed is:

1. A memory device, comprising:
   a memory cell having a reprogrammable resistance range, the memory cell comprising a chalcogenide material and a metal plug; and
   a selector configured to set the memory cell to a one-time programmable resistance level for the memory cell outside the reprogrammable resistance range.

2. The memory device of claim 1, wherein the selector is configured to set the memory cell to the one-time programmable resistance level outside the reprogrammable resistance range by forming a resistance path at least partially surrounded by the chalcogenide material.

3. The memory device of claim 2, wherein the resistance path is a metallic path.

4. The memory device of claim 3, wherein the selector is configured to form the metallic path at least in part by causing metallic ions to migrate from the metal plug into the chalcogenide material.

5. The memory device of claim 3, wherein the memory cell is configured to operate as an anti-fuse based at least in part on the metallic path.

6. The memory device of claim 2, wherein the resistance path is a void.

7. The memory device of claim 6, wherein the selector is configured to form the void at least in part by applying a bias current to the memory cell.

8. The memory device of claim 6, wherein the memory cell is configured to operate as a fuse based at least in part on the void.

9. The memory device of claim 1, wherein the selector is configured to set the memory cell to the one-time programmable resistance level outside the reprogrammable resistance range by applying a directional bias current to the memory cell.

10. The memory device of claim 9 wherein the directional bias current is a forward bias current sufficient to operate the memory cell as an anti-fuse.

11. The memory device of claim 9 wherein the directional bias current is a negative bias current sufficient to operate the memory cell as a fuse.

12. A method comprising:
    applying a directional bias current to a memory cell comprising a chalcogenide material and a metal plug,
    wherein the memory cell has a reprogrammable resistance range and the directional bias current has a magnitude to form a resistance path at least partially surrounded by the chalcogenide material, and
    wherein the memory cell has a read-only resistance outside the reprogrammable resistance range after the resistance path is formed.

13. The method of claim 12, Therein forming the resistance path comprises operating the memory cell as an anti-fuse.

14. The method of claim 12, wherein forming the resistance path comprises operating the memory cell as a fuse.

15. The method of claim 12, wherein forming the resistance path comprises forming a metallic path.

16. The method of claim 15, wherein forming the metallic path comprises causing migration of metallic ions from the metal plug.

17. The method of claim 12, wherein forming the resistance path comprises forming a void.

18. The method of claim 12, further comprising:
    incorporating the memory cell into an integrated circuit after forming the resistance path.

19. A memory device, comprising:
    a memory array including a plurality of memory cells, each memory cell in the memory array having a reprogrammable resistance range and comprising a chalcogenide material and a metal plug;
    a first selector configured to set a first memory cell to a first resistance level, the first resistance level being a one-time programmable resistance level for the memory cell that is outside the reprogrammable resistance range; and
    a second selector configured to set a second memory cell to a second resistance level, the second resistance level within the reprogrammable resistance range.

20. The memory device of claim 19, wherein the first selector is configured to set the first memory cell to the first resistance level by forming a resistance path at least partially surrounded by the chalcogenide material.

21. The memory device of claim 19, wherein the second selector is configured to set the second memory cell to the second resistance level by switching the chalcogenide material between at least two resistance states within the reprogrammable resistance range.

* * * * *